(12) United States Patent
Liu et al.

(10) Patent No.: US 6,188,265 B1
(45) Date of Patent: *Feb. 13, 2001

(54) HIGH-VOLTAGE NMOS SWITCH (75) Inventors: Kwo-Jen Liu, San Jose; Chuck Cheng-Wing Cheng, Saratoga, both of CA (US)

(73) Assignee: Scenix Semiconduction, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/989,846

(22) Filed: Dec. 12, 1997

(51) Int. Cl.[7] ..................................................... H03K 17/16
(52) U.S. Cl. ........................... 327/390; 327/536; 327/589
(58) Field of Search .................................. 327/390, 536, 327/537, 589; 307/110, 126, 130

(56) References Cited

U.S. PATENT DOCUMENTS

| | | |
|---|---|---|
| 4,347,448 * 8/1982 | Plachno | 327/109 |
| 4,689,495 8/1987 | Liu . | |
| 5,023,474 * 6/1991 | Wilcox | 327/390 |
| 5,241,502 * 8/1993 | Lee et al. | 365/203 |
| 5,357,416 * 10/1994 | Kitano et al. | 363/60 |
| 5,365,118 * 11/1994 | Wilcox | 327/390 |
| 5,394,365 * 2/1995 | Tsukikawa | 365/189.09 |
| 5,499,183 * 3/1996 | Kobatake | 327/536 |
| 5,521,546 * 5/1996 | Kim | 327/536 |
| 5,521,871 * 5/1996 | Choi | 365/189.11 |
| 5,604,711 2/1997 | Cheung | 365/230.06 |
| 5,646,571 * 7/1997 | Ohashi | 327/390 |
| 5,712,778 * 1/1998 | Moon | 363/60 |

* cited by examiner

Primary Examiner—Terry D. Cunningham
(74) Attorney, Agent, or Firm—Fenwick & West LLP (57) ABSTRACT

A high voltage NMOS switch is adjustable in order to optimize the switch for proper operation with different circuit configurations. A high voltage booster, included within the high voltage NMOS switch, enables the switch to reclaim the previously unused second half-cycle of a power source waveform signal, which thereby increases the speed of the NMOS switch by a factor of two. In addition, the high voltage NMOS switch provides added ramp rate flexibility by enabling a user to optimize the ramp rate of the high voltage NMOS switch for different circuit configurations.

14 Claims, 11 Drawing Sheets

HIGH-VOLTAGE NMOS SWITCH

RELATED APPLICATION

The subject matter of this application is related to the subject matter of application Serial No. 08/989,936 entitled "High Speed, Noise Immune, Single Ended Sensing Scheme for Non-Volatile Memories," applicant's reference number 3135, filed concurrently herewith by Kwo-Jen Liu and Chuck Cheuk-Wing Cheng and having the same assignee as the present invention and is incorporated herein by reference in its entirety.

BACKGROUND OF THE INVENTION

1. Field of the Invention

The present invention relates generally to high voltage switching, and more particularly to a more flexible system for switching between a low voltage and a high voltage at an adjustable ramp rate.

2. Description of Background of Art

An erasable programmable read-only memory ("EPROM") is a non-volatile integrated memory circuit, which stores data in memory cells constructed from enhancement-type n-channel metal-oxide semiconductor field effect ("NMOS") memory transistors. Each EPROM memory cell is one single memory transistor, which is logically organized into a memory array of aligned rows representing word lines and aligned columns representing bit lines. To select a memory cell for either programming or erasing, a row decoder and column decoder, each with separate high voltage switches corresponding to specific word lines and bit lines, activate the word line and bit line corresponding to the selected memory cell.

When a selected memory cell is programmed, the memory transistor of the memory cell is placed into the "0" logic state by lowering the threshold voltage level of the memory transistor to approximately 0.5V to 1V. When the memory cell is erased by a technique such as exposing the memory cell to UV light, the memory transistor is placed into the "1" logic state by increasing the threshold voltage level of the memory transistor to approximately 5V or higher.

Another type of memory device is an electrically erasable programmable read only memory ("EEPROM"). For EEPROMs, each EEPROM memory cell, unlike the EPROM memory cell, consists of two NMOS transistors, a "select" transistor and the memory transistor.

Typically, during the programming operation for the memory cells, a high voltage $V_{pp}$ of about 12 to 20 volts is transferred by the row and column decoders to the selected word line to turn "on" the select transistor of the selected memory cell. By further transferring $V_{pp}$ to the selected bit line attached to the drain electrode of the select transistor and approximately 0 volts to the control gate of the memory transistor, a small tunneling current lowers the threshold voltage of the memory transistor to approximately a range of 0.8V to −2V.

During the erasure operation, the control gate of the selected memory cell is raised to a high voltage $V_{pp}$ and the bit line of the selected memory cell is lowered to 0 volts. Since the floating gate is electrically isolated from the memory transistor, once the high voltage $V_{pp}$ is removed, a charge remains on the floating gate and the threshold voltage of the memory transistor is raised to at least approximately half of the read voltage $V_{cc}$. $V_{cc}$ is approximately 1.5 to 6 volts.

Figure 1A:
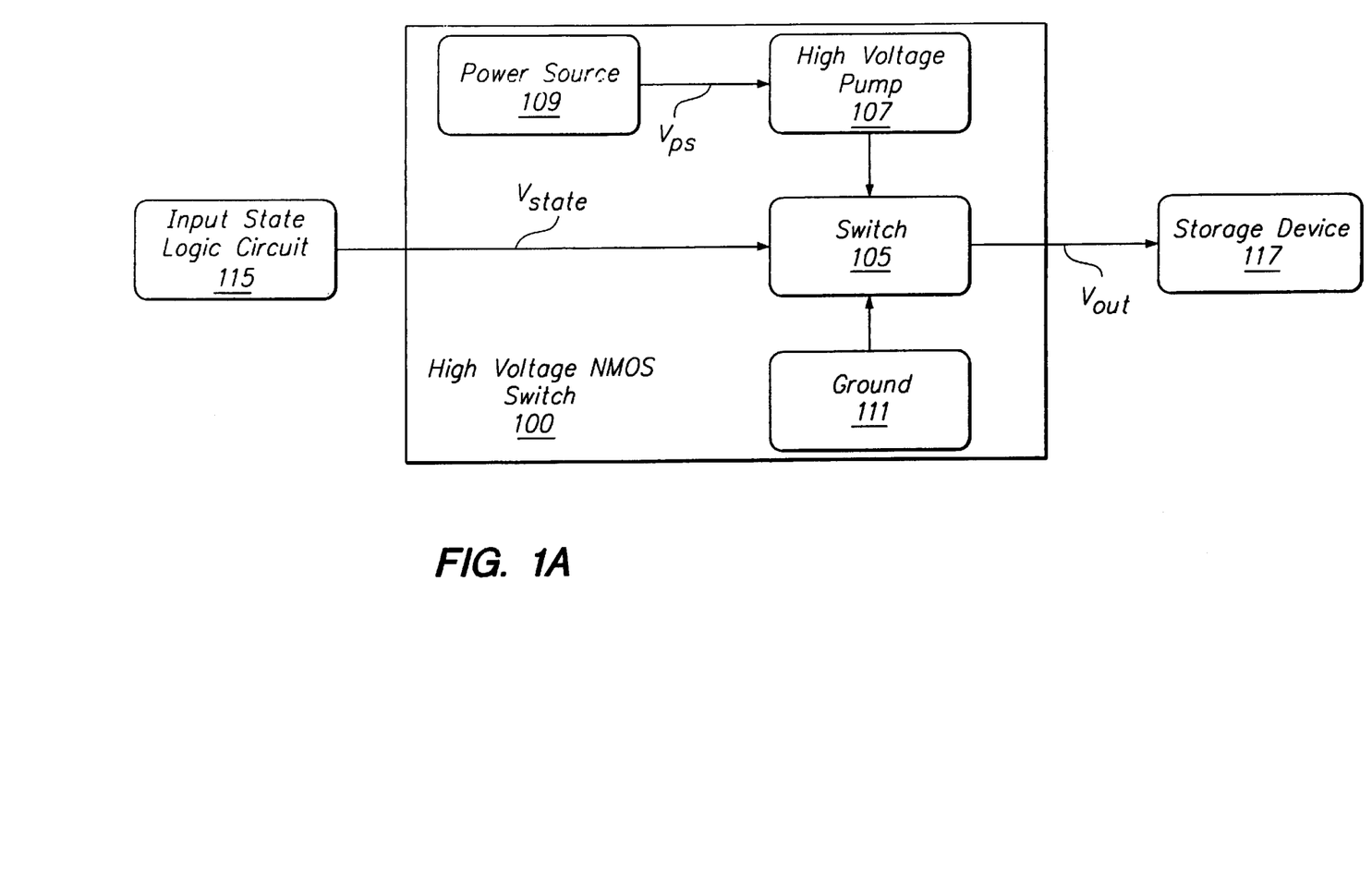
FIG. 1A is an illustration of a high level schematic drawing showing the conventional design for a high voltage NMOS switch design.

To switch between memory cells to alter the logic states of these memory cells, the row and column decoders rely upon a plurality of high voltage NMOS switches to switch between a high and a low voltage level. FIG. 1A illustrates a high level schematic drawing of one of these conventional high voltage NMOS switch designs 100 which is electrically interconnected between the output of an input state logic circuit 115 and an input of a storage device 117 such as a memory array. To simplify the discussion, even though a plurality of high voltage NMOS switches 100 in conjunction with the input state logic circuit 115 comprise a decoder, only one of the high voltage NMOS switches 100 will be illustrated.

The high voltage NMOS switch 100 includes a switch 105, a high voltage pump 107, a power source 109, and a connection to ground 111. The switch 105 receives either a high or a low input logic state $V_{state}$ from an input state logic circuit 115, which the switch 105 in turn transforms into either a distinct low or high switch output voltage level $V_{out}$ for the storage device 117. It should be noted that the switch output voltage level $V_{out}$ can also be considered the output voltage level of the overall decoder, which is not shown.

Figure 3:
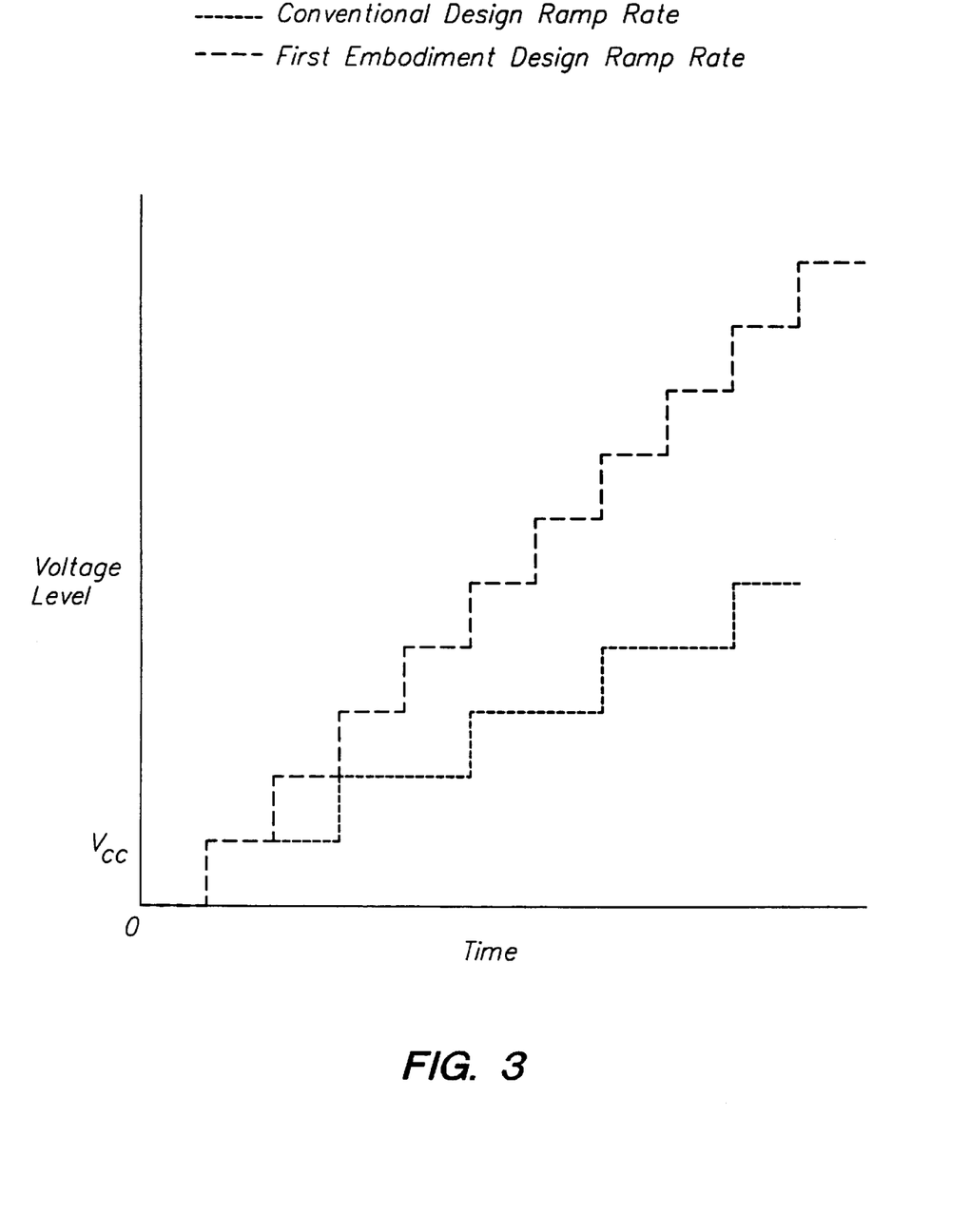
FIG. 3 is an illustration of the ramp rate of both the conventional design from FIGS. 1A and 1B and the first embodiment from FIGS. 2A and 2B.

For example, if $V_{state}$ is in a high or "1" logic state, the switch 105 connects a switch output node 125 with ground 111 resulting in the switch output voltage level $V_{out}$ dropping to 0 volts. If the switch 105 receives $V_{state}$ in a low or "0" logic state, the high voltage pump 107 ramps up $V_{out}$ to a high voltage output level $V_{pp}$ (e.g. 10–20V) based solely upon a first half-cycle of a power source waveform signal $V_{ps}$, which is illustrated in FIG. 3. A more detailed description of the high voltage pump 107 will be discussed in FIG. 1B.

Figure 1B:
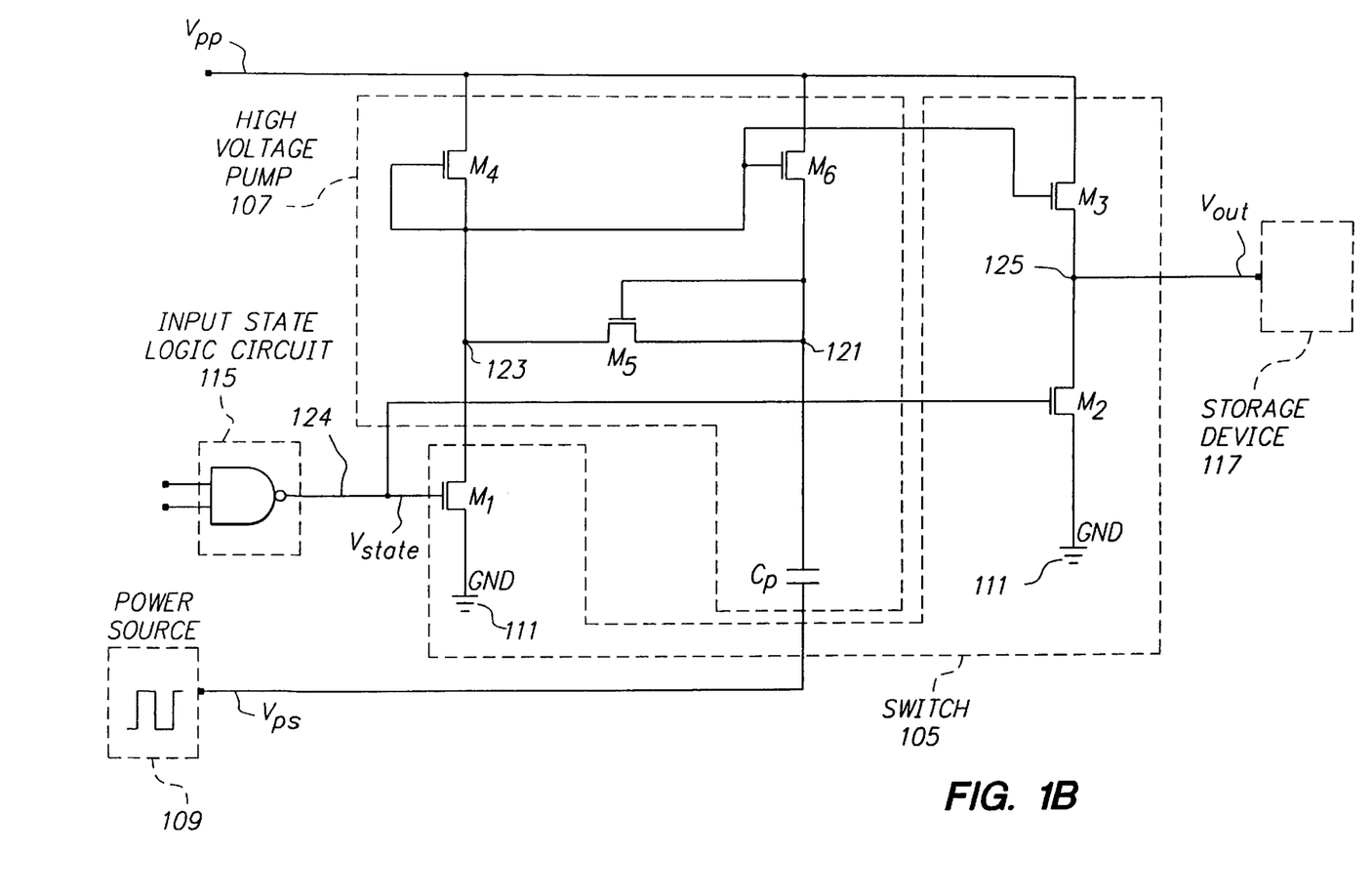
FIG. 1B is an illustration of a detailed schematic drawing for the conventional high voltage NMOS switch design.

FIG. 1B is an illustration of a more detailed schematic drawing of the conventional high voltage switch 100 discussed in FIG. 1A. The high voltage switch 100 more specifically includes three transistor switches, $M_1$, $M_2$, $M_3$, a clamping diode transistor $M_4$, two high voltage pump transistor diodes, $M_5$ and $M_6$, a high voltage pump coupling capacitor, $C_p$, and a power source 109.

The switch 105 discussed in FIG. 1A consists of NMOS transistor switches $M_1$, $M_2$, and $M_3$. Transistors $M_1$ and $M_2$ have gate electrodes which are electrically coupled together with the input state logic circuit 115 at an input node 124. The source electrodes of $M_1$ and $M_2$ are electrically coupled to ground 111. The drain electrode of $M_1$ is electrically coupled to the output of the high voltage pump 107 at node 123 as well as to the control gate electrode of transistor $M_3$. The drain electrode of $M_2$ is electrically coupled with the output node 125 which is also electrically coupled to the source gate of transistor $M_3$. The drain electrode of transistor $M_3$ is electrically coupled to the high voltage output level $V_{pp}$.

As discussed above, when the input state logic circuit 115 transmits $V_{state}$ in a high logic state, transistor switches $M_1$ and $M_2$ close and the output node 125 is connected directly with ground 111 resulting in $V_{out}$ dropping to 0 volts. When the input state logic circuit 115 transmits $V_{state}$ in a low logic state, $M_1$ and $M_2$ remain open, thereby allowing the high voltage pump 107 to begin ramping up $V_{out}$ to the high voltage output level $V_{pp}$.

The high voltage pump 107 includes a clamping diode transistor $M_4$, a coupling capacitor $C_p$, and pumping transistor diodes, $M_5$ and $M_6$. $C_p$ is electrically coupled to the power source 109, which generates a power source waveform signal $V_{ps}$ having a first half-cycle at $V_{cc}$ (e.g. 5 volts) and a second half-cycle at 0 volts. As illustrated in FIG. 3, in the first half-cycle of the power source waveform signal $V_{ps}$, the voltage level rises from 0 to $V_{cc}$. During the second half-cycle of the power source waveform signal $V_{ps}$, the voltage level drops from $V_{cc}$ to 0 volts. $C_p$ isolates the power source waveform signal $V_{ps}$ from the high voltage pump 107.

Pumping transistor diodes $M_5$ and $M_6$ receive the coupled power source waveform signal $V_{ps}$ and, as illustrated in FIG. 3, the switch output voltage level $V_{out}$ is ramped up to higher voltage levels during only the first half of the full ramp up potential of the switch 100. More specifically, since $V_{ps}$ continually alternates in half-cycles between a high voltage level $V_{cc}$ and 0 volts, the ramp up of $V_{out}$ only occurs during the first half-cycle (e.g. when the voltage level increases from 0 volts to $V_{cc}$) of each full-cycle of $V_{ps}$. The second half-cycle of $V_{ps}$ remains unused.

During this first half-cycle of $V_{ps}$, $V_{121}$ and $V_{123}$ can be mathematically described using the following equations:

$$V_{121} = V_{ps}(C_1/(C_1+C_{121}))$$

$$V_{123} = V_{121} - V_{TM5}$$

where $C_1$ is the capacitance of $C_p$, $C_{121}$ is the stray capacitance of node 121, $V_{ps}$ is approximately equal to $V_{cc}$, and $V_{TM5}$ is the threshold voltage for transistor diode $M_5$. During the second half-cycle of $V_{ps}$, no additional ramp up of $V_{121}$ or $V_{123}$ occurs.

After each full cycle of $V_{ps}$, $V_{121}$ and $V_{123}$ continue to ramp up during only the first half-cycle of $V_{ps}$ toward a voltage level of $V_{pp}+V_{TM4}$. During these additional first half-cycles of $V_{ps}$, the new $V_{121}$ and $V_{123}$ can be mathematically represented by the following equation:

$$V_{121(new)} = V_{ps}(C/(C+C_{121})) + V_{123(old)} - V_{TM6}$$

$$V_{123(new)} = V_{121(new)} - V_{TM5}$$

where $V_{121(new)}$ and $V_{123(new)}$ are the new voltages $V_{121}$ and $V_{123}$, which relate to the new full-cycle of $V_{ps}$. $V_{121(old)}$ and $V_{123(old)}$ relate to the voltages $V_{121}$ and $V_{123}$ from the preceding full cycle of $V_{ps}$.

During the increase in the intermediate voltages $V_{121}$ and $V_{123}$, the switch output voltage level $V_{out}$ can be mathematically represented by the following equation:

$$V_{out} = V_{123(new)} - V_{TM3}$$

where $V_{TM3}$ is the threshold voltage for transistor $M_3$. After a certain number of full cycles of $V_{ps}$, $V_{123(new)}$ will reach its maximum voltage of $V_{pp}+V_{TM4}$ which in turn raises the switch output voltage level to its high voltage output level $V_{pp}$. $V_{out}$ can be mathematically described by the following equation:

$$V_{out} = V_{pp} + V_{TM4} - V_{TM3} = V_{pp}$$

where threshold voltages $V_{TM3}$ and $V_{TM4}$ of $M_3$ or $M_4$ are approximately equal in this embodiment of the present invention.

To clamp $V_{123}$ at $V_{pp}+V_{TM4}$, the desired high voltage value, the clamping diode transistor $M_4$, whose gate and drain electrodes are electrically coupled to node 123, will discharge any $V_{123}$ voltage levels, which are in excess of $V_{pp}+V_{TM4}$.

During the read mode, when a read voltage $V_{cc}$ is applied to the memory cells containing the programmed "0" logic state, those memory cells will conduct heavily and lower the bit line voltage level to a low voltage level. Alternatively, when a read voltage $V_{cc}$ is applied to the memory cells containing the erased "1" logic state, the memory cell will not conduct, thereby leaving the bit line at a high voltage level. To determine whether the memory cell is in a "1" logic state or a "0" logic state, a sensing scheme is attached to the memory cell bit line in order to detect these changes in the bit line voltage level.

With the speed of programming a non-volatile memory circuit dependent upon the speed of the decoders, it is always desirable to modify the conventional high voltage switches in order to further increase the ramp rate period for ramping up the high voltage switch voltage level from a low to a high voltage. In addition, since each type of non-volatile memory circuit possesses different voltage characteristics, it also is desirable for the high voltage switch to be able to be optimized for the different applications, which require different high voltage switch ramp rates.

What, therefore, is needed is a system for increasing the ramp rate of a high voltage NMOS switch and for maintaining a ramp rate, which can be adjusted for different applications.

SUMMARY OF THE INVENTION

Accordingly, the high voltage NMOS switch design of the present invention maintains a fast ramp rate, while, at the same time, ensuring that the ramp rate can be more flexibly adjusted. Such greater and more flexible ramp rates result in a more robust high voltage NMOS switch, which can be optimized for more varied types of non-volatile memory circuit applications.

The increased ramp rate is achieved by utilizing a high voltage booster, which is attached to the high voltage pump of conventional high voltage NMOS circuit designs. This high voltage booster maintains a fast ramp rate by reclaiming the previously unused second half-cycle of the oscillating waveform power source. More specifically, since the previous high voltage pump only increased the high voltage switch voltage during the first half-cycle of the oscillating waveform power signal, the high voltage booster, which during the second half-cycle, increases the high voltage switch voltage by approximately the same amount as the first half-cycle, increases the ramp rate by a factor of two. To ensure that even with this higher ramp rate the high voltage NMOS switch maintains a flexible ramp rate, the high voltage NMOS switch of the present invention allows a user to adjust a coupling capacitance and an oscillator frequency in order to optimize the high voltage NMOS switch ramp rate for alternative applications.

DETAILED DESCRIPTION OF THE PREFERRED EMBODIMENTS

A preferred embodiment of the present invention is now described with reference to the figures where like reference numbers indicate identical or functionally similar devices. Also in the figures, the left most digit of each reference number corresponds to the figure in which the reference number is first used.

The present invention is directed to a high voltage switch system, utilizing NMOS transistor technology, for quickly switching between a low voltage level and a high voltage level for storage devices such as EPROM, EEPROM or flash memory. The high voltage NMOS switch receives from an input state logic circuit an input state voltage, which is either in a high or a low state. The high voltage NMOS switch then translates the low or high state into either a corresponding low or high switch output voltage level. To raise the output voltage from a low to a high output voltage level, the high voltage NMOS switch relies upon a high voltage pump as well as a high voltage booster to raise the switch output voltage level to a specific high voltage level. To lower the output voltage from a high to a low switch output voltage level, the high voltage switch directly connects the switch output node to ground.

Figure 2A:
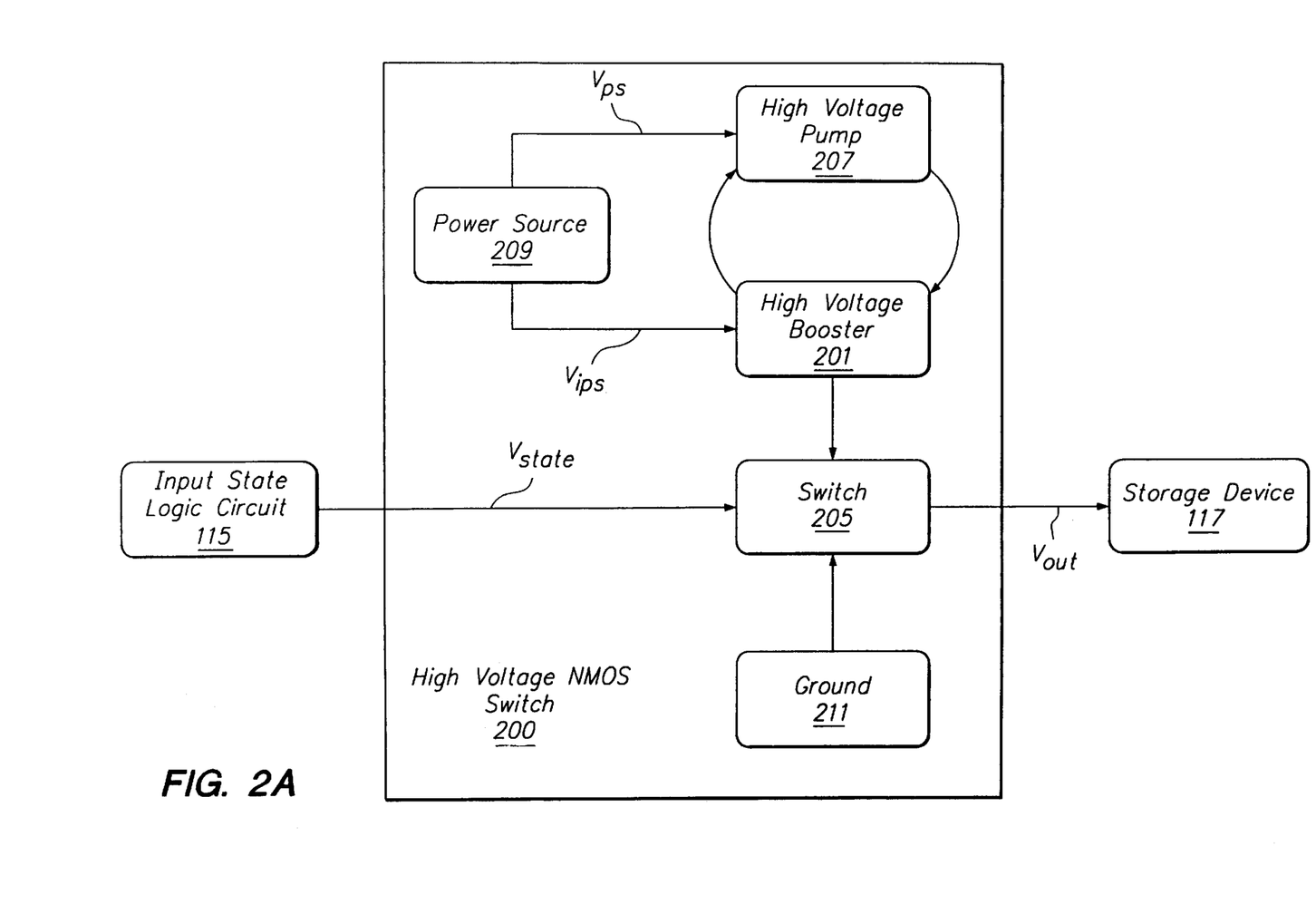
FIG. 2A is an illustration of a high level schematic drawing of a first embodiment of the high voltage NMOS switch design.

FIG. 2A in conjunction with FIG. 3 is an illustration of a high level schematic drawing of a first preferred embodiment of a high voltage NMOS switch 200 design of the present invention. The high voltage NMOS switch 200 includes a high voltage booster 201, a power source 209, a high voltage pump 207, a switch 205, and a connection to ground 211. A plurality of high voltage NMOS switches 200 and the input state logic circuit 115 comprise a decoder, which is not shown. To simplify the discussion, only one of the plurality of high voltage NMOS switches 200 is illustrated.

The switch 205 receives from the input state logic circuit 115 either a high or low input state logic $V_{state}$. If the switch 205 receives $V_{state}$ in a high logic state, the switch 205 connects with ground 211 and transfers the switch output $V_{out}$ voltage level of 0 volts to the storage device 117. Unlike the conventional design, however, if the switch 205 receives $V_{state}$ in a low logic level, the switch will connect with the high voltage pump 207 as well as with the high voltage booster 201 resulting in $V_{out}$ ramping up to a high voltage output level $V_{pp}$ (e.g. 10–20 volts) during both the first and second half-cycle of the power source waveform signal $V_{ps}$.

As discussed previously with regard to the conventional high voltage switch 100, the high voltage pump 207 only ramps up the voltage level during the first half-cycle of $V_{ps}$.

The high voltage booster 201, however, utilizes an inverted power source waveform signal $V_{ips}$ to utilize the previously unused second half-cycle of $V_{ps}$. As illustrated in FIG. 3, this reclamation of the second half-cycle of $V_{ps}$ through the use of $V_{ips}$ results in the use of the full-cycle of the power signal waveform signal $V_{ps}$. As can be further observed in FIG. 3, after each fall cycle of $V_{ps}$ and $V_{ips}$, $V_{out}$ increases by approximately double the ramp rate of the conventional NMOS switch design 100 discussed in FIGS. 1A and B. The final result of this doubling of the ramp rate, as can be seen in FIG. 3, is that the switching speed of the NMOS high voltage switch 200 will be approximately doubled from the switching speed of the conventional NMOS high voltage switch 100. A more detailed discussion of the high voltage booster 201 will be discussed in FIG. 2B.

Figure 2B:
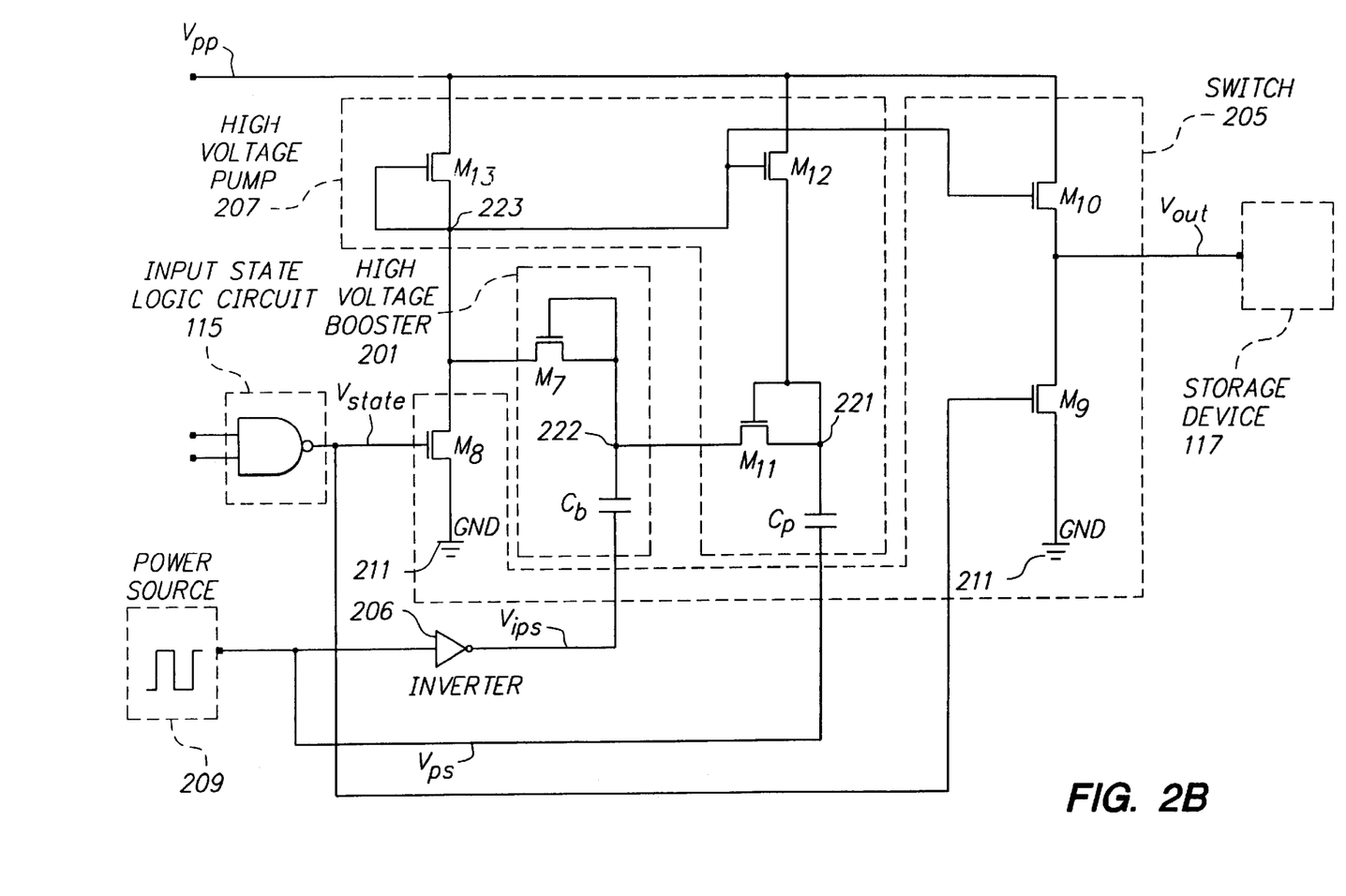
FIG. 2B is an illustration of a detailed schematic drawing of a first embodiment of the high voltage NMOS switch design.

FIG. 2B discussed in conjunction with FIG. 3 is an illustration of a detailed schematic drawing of the first embodiment of the high voltage NMOS switch 200. The high voltage NMOS switch 200 more specifically includes an inverter 206, a high voltage booster transistor diode $M_7$, a high voltage booster coupling capacitor $C_b$, three transistor switches, $M_8$, $M_9$, $M_{10}$, a clamping diode transistor $M_{13}$, two high voltage pump transistor diodes, $M_{11}$ and $M_{12}$, a high voltage pump coupling capacitor, $C_p$, and a power source 209.

The high voltage booster 201 includes the high voltage booster transistor $M_7$ and the high voltage booster coupling capacitor $C_b$. By electrically coupling the inverter 206 between the power source 209 and $C_b$, the inverter 206 creates a complimentary phase power source waveform $V_{ips}$ for the high voltage booster 201. The high voltage booster transistor $M_7$ is electrically coupled between the output source electrode of the pumping transistor diode $M_{11}$ and the gate electrode of pumping transistor diode $M_{12}$.

To more fully understand the effects of having the high voltage booster transistor $M_7$ and the coupling capacitor $C_b$ inserted into the high voltage NMOS switch 200 to increase the ramp rate of $V_{out}$, a discussion of the intermediate voltage characteristics $V_{221}$ and $V_{222}$ of the high voltage NMOS switch 200 during a full clock cycle of the power source waveform signals $V_{ps}$ and $V_{ips}$ is now set forth.

During the first half-cycle of $V_{ps}$ after $V_{ps\ (1st\ half\ cycle)}$ rises from 0 volts to $V_{cc}$ and $V_{ips}$ drops from $V_{cc}$ to 0 volts, the voltage $V_{221}$ at node 221 is ramped up toward $V_{pp}$. $V_{221}$ can be mathematically described by the following equation:

$$V_{221} = V_{ps(1st\ half\ cycle)} * (C_1/(C_1 + C_{221}))$$

where $C_1$ is the capacitance of $C_p$, $C_{221}$ is the stray capacitance of node 221, $V_{ps(1st\ half\ cycle)}$ is approximately equal to $V_{cc}$.

Unlike the conventional design, during the second half-cycle of $V_{ps}$ after $V_{ps(2nd\ half\ cycle)}$ drops from $V_{cc}$ to 0 volts and $V_{ips}$ rises from 0 volts to $V_{cc}$, the voltage $V_{222}$ at node 222 raises $V_{221}$ even closer to $V_{pp}$. $V_{222}$ can be mathematically described by the following equation:

$$V_{222} = V_{221} - V_{TM11} + V_{ips(2nd\ half\ cycle)} * (C_2/(C_2 + C_{222})) = 2V_{221} - V_{TM11}$$

where $C_2$ is the capacitance of $C_b$ which is approximately equal to $C_1$, $C_{222}$ is the stray capacitance of node 222, which is approximately equal to $C_{221}$, $V_{ips(2nd\ half\ cycle)}$ is approximately equal $V_{ps(1st\ half\ cycle)}$, which is $V_{cc}$ and $V_{TM11}$ is the threshold voltage for transistor diode $M_{11}$. With regard to the voltage $V_{223}$ at node 223, $V_{223}$ can be mathematically described by the following equation:

$$V_{223} = 2V_{221} - V_{TM11} - V_{TM7}$$

$V_{223}$, however, will never exceed $V_{pp}+V_{TM13}$ because of the clamping diode transistor $M_{13}$. The high voltage pump 207 and high voltage booster 201, therefore, will continue to raise the internal voltage of the high voltage NMOS switch 200 until it reaches $V_{pp}+V_{TM13}$. $V_{out}$, respectively, will continue to rise until it reaches $V_{pp}$. $V_{out}$ can be mathematically described by the following equation:

$$V_{out}=V_{pp}+V_{TM13}-V_{TM10}=V_{pp}$$

where threshold voltages $V_{TM10}$ and $V_{TM13}$ of $M_{10}$ or $M_{13}$ are approximately equal.

Figure 4A:
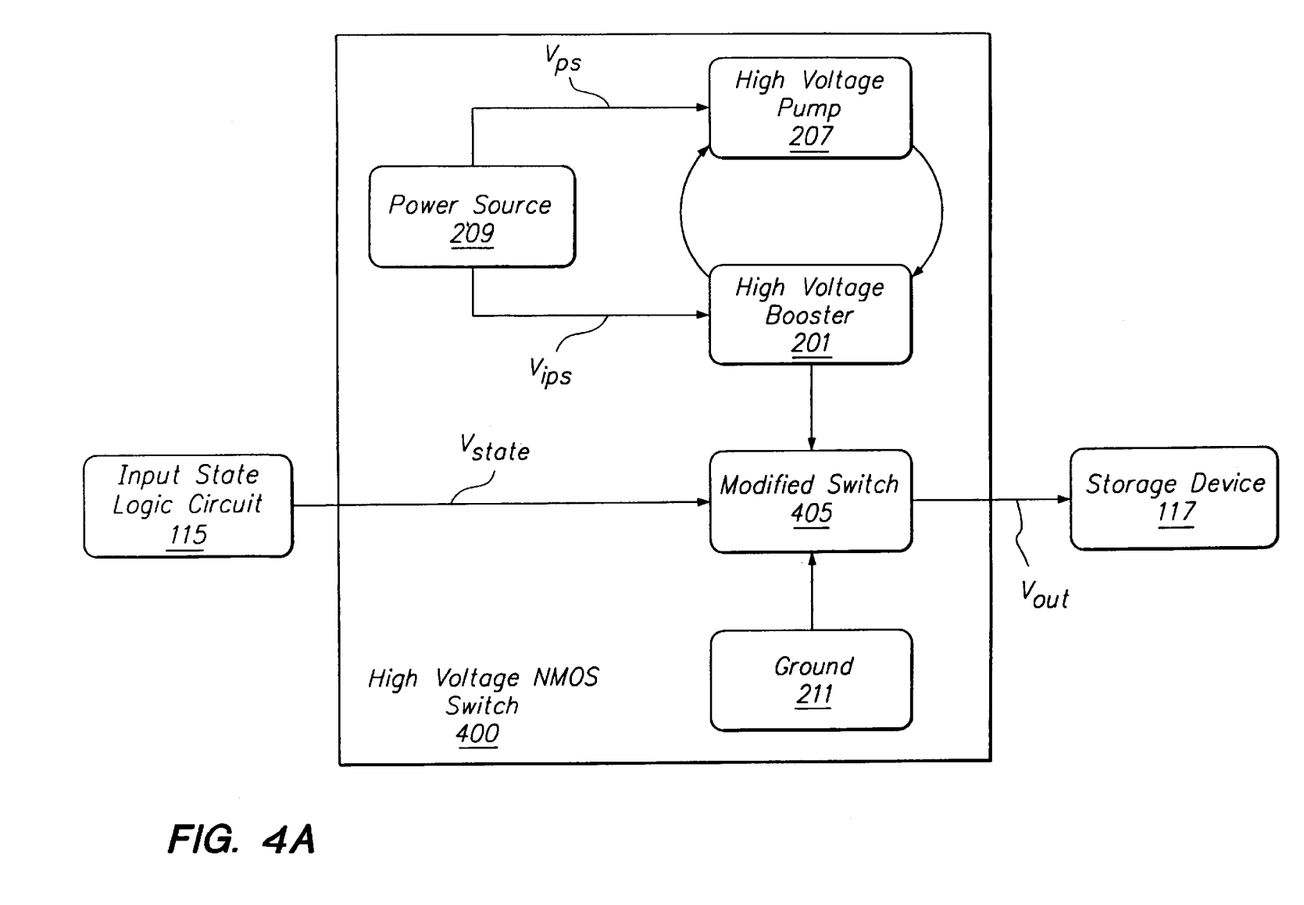
FIG. 4A is an illustration of a high level schematic drawing of a second embodiment of the high voltage NMOS switch design.

FIG. 4A is an illustration of a high level schematic drawing of a second embodiment of the high voltage NMOS switch 400 design of the present invention. The high voltage NMOS switch 400 includes a modified switch 405, the power source 209, the high voltage pump 207, the high voltage booster 201, and the connection to ground 211. A plurality of high voltage NMOS switches 400 and the input state logic circuit 115 comprise a decoder, which is not shown. To simplify the discussion, only one of the plurality of high voltage NMOS switches 400 is illustrated.

The modified switch 405, unlike the switch 205 of the first embodiment, is able to raise the switch output $V_{out}$ to a high voltage level of approximately $V_{pp}+V_{TM13}$, rather than merely $V_{pp}$. In addition, this high voltage switch design 400 can raise the switch output $V_{out}$ from 0 volts to $V_{pp}+V_{TM13}$ within the same amount of time as the first embodiment, thereby further increasing the ramp rate of the high voltage NMOS switch 400. A more detailed description of the modified switch 405 will be discussed in FIG. 4B.

Figure 4B:
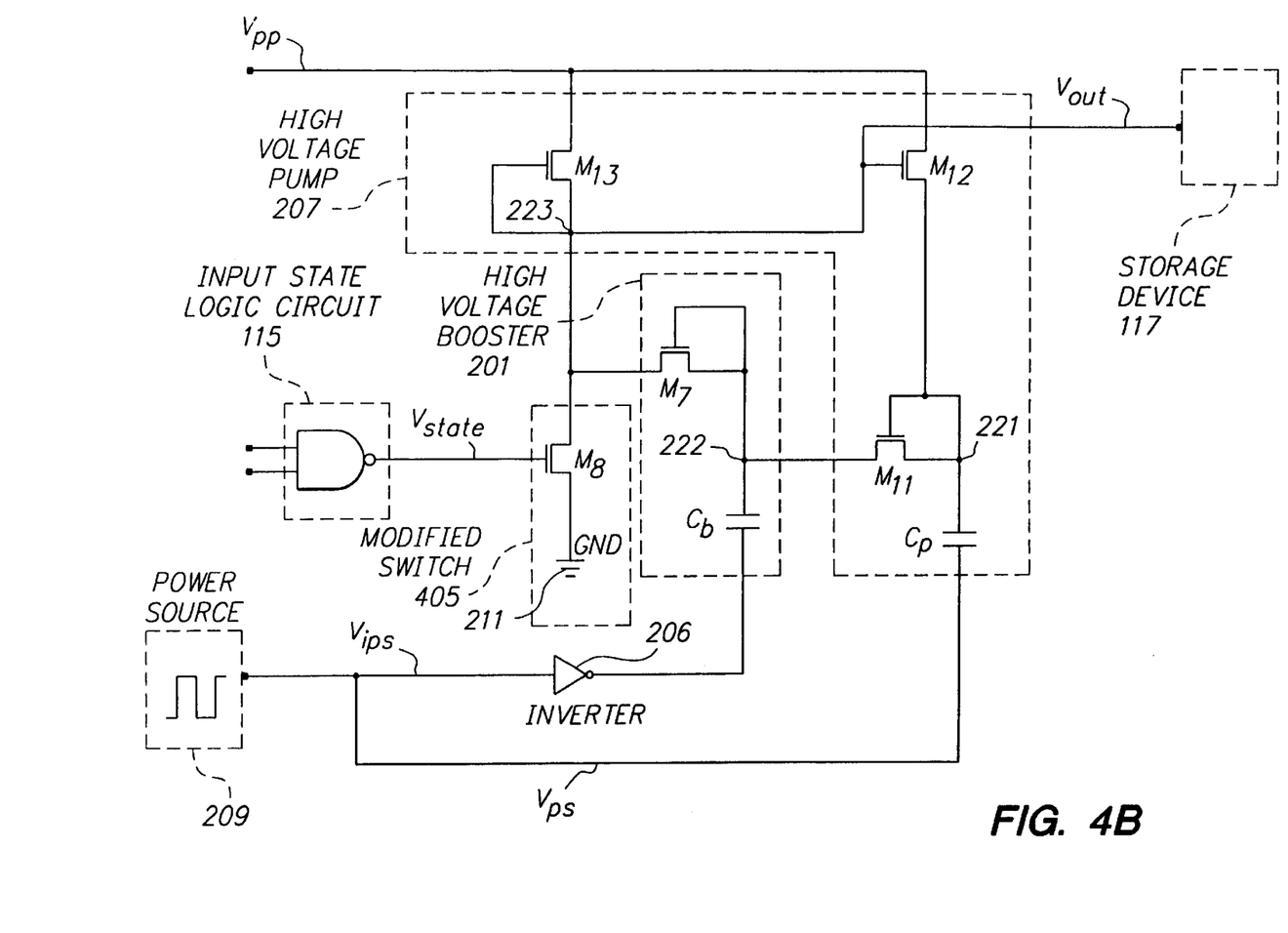
FIG. 4B is an illustration of a detailed schematic drawing of the second embodiment of the high voltage NMOS switch design.

FIG. 4B is an illustration of a detailed schematic drawing of the second embodiment of the high voltage NMOS switch 400 design. The modified switch 405 includes only one transistor switch $M_8$. With regard to the high level voltage level, the modified switch 405 avoids the voltage drop $V_{TM10}$, which occurred in the first embodiment, through the removal of the transistor $M_{10}$ in the modified switch 405. This modification results in the switch output $V_{out}$ connecting directly with node 223, thereby avoiding the threshold voltage drop associated with $M_{10}$ and resulting in the switch output $V_{out}$ voltage reaching $V_{pp}+V_{TM13}$, rather than merely $V_{pp}$.

With regard to the low level voltage, the absence of switch transistor $M_9$ from the modified switch 400 has no adverse effect on the high voltage NMOS switch 400. With $V_{out}$ directly connected to $V_{223}$ and with switch transistor $M_8$ grounding $V_{223}$, $V_{out}$ will still drop to 0 volts when the input state logic circuit 115 is in a high logic state.

This modified switch 405, therefore, enables a user to optimize the high voltage switch 400 to exhibit a more variable ramp up rate.

Figure 5A:
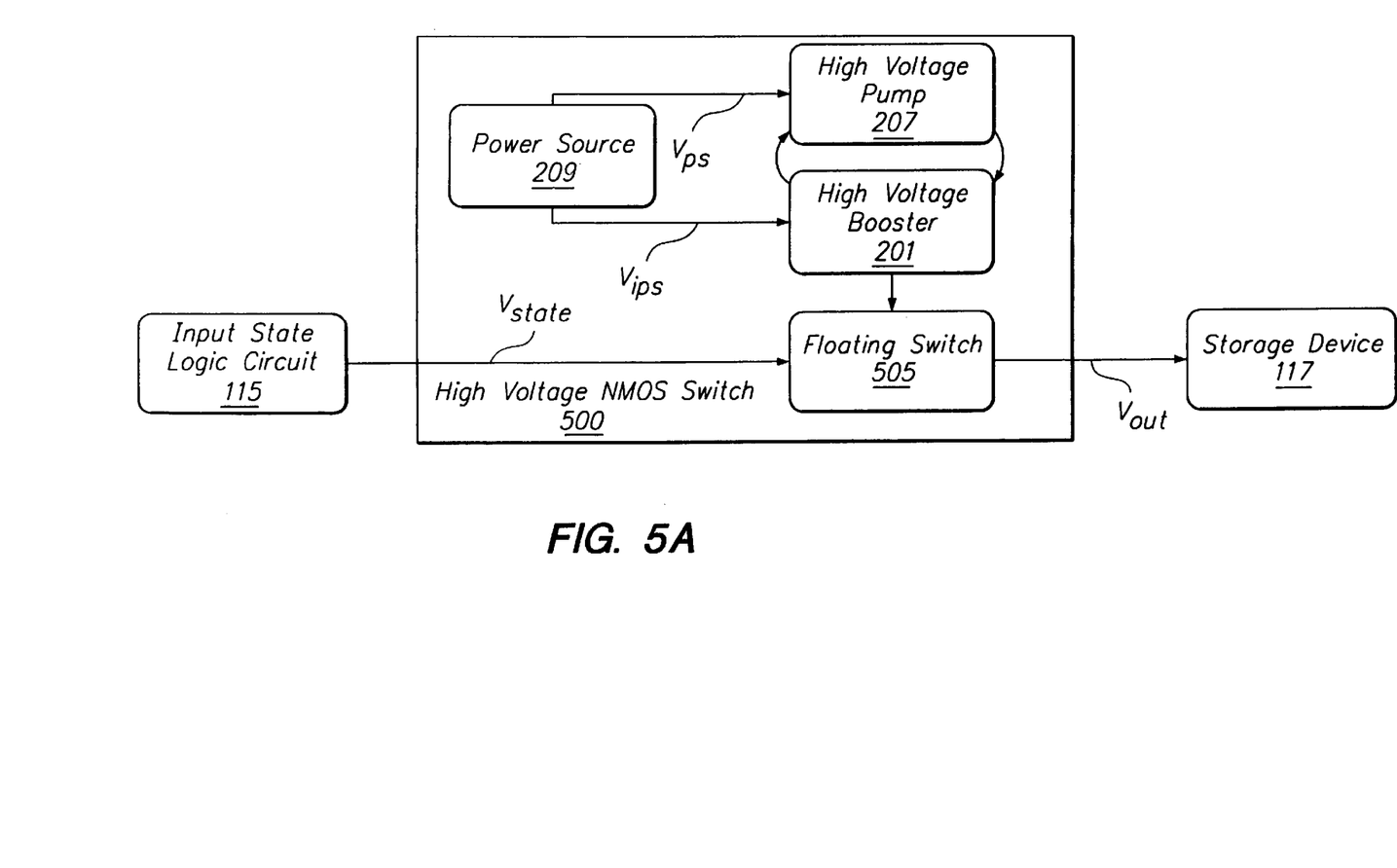
FIG. 5A is an illustration of a high level schematic drawing of a third embodiment of the high voltage NMOS switch design.

FIG. 5A is an illustration of a high level schematic drawing of a third embodiment of the high voltage NMOS switch 500 of the present invention. The high voltage NMOS switch 500 includes a floating switch 505, the power source 209, the high voltage pump 207, the high voltage booster 201. A plurality of high voltage NMOS switches 500 and the input state logic circuit 115 comprise a decoder, which is not shown. To simplify the discussion, only one of the plurality of high voltage NMOS switches 500 is illustrated.

The floating switch 505 is similar to the switch 205 from the first embodiment, except that at the high state logic level, the floating switch 505 does not connect to ground. Rather, the floating switch 505 leaves the switch output $V_{out}$ floating at some voltage level below the high voltage level of $V_{pp}$. This floating switch will be described in further detail in FIG. 5B.

Figure 5B:
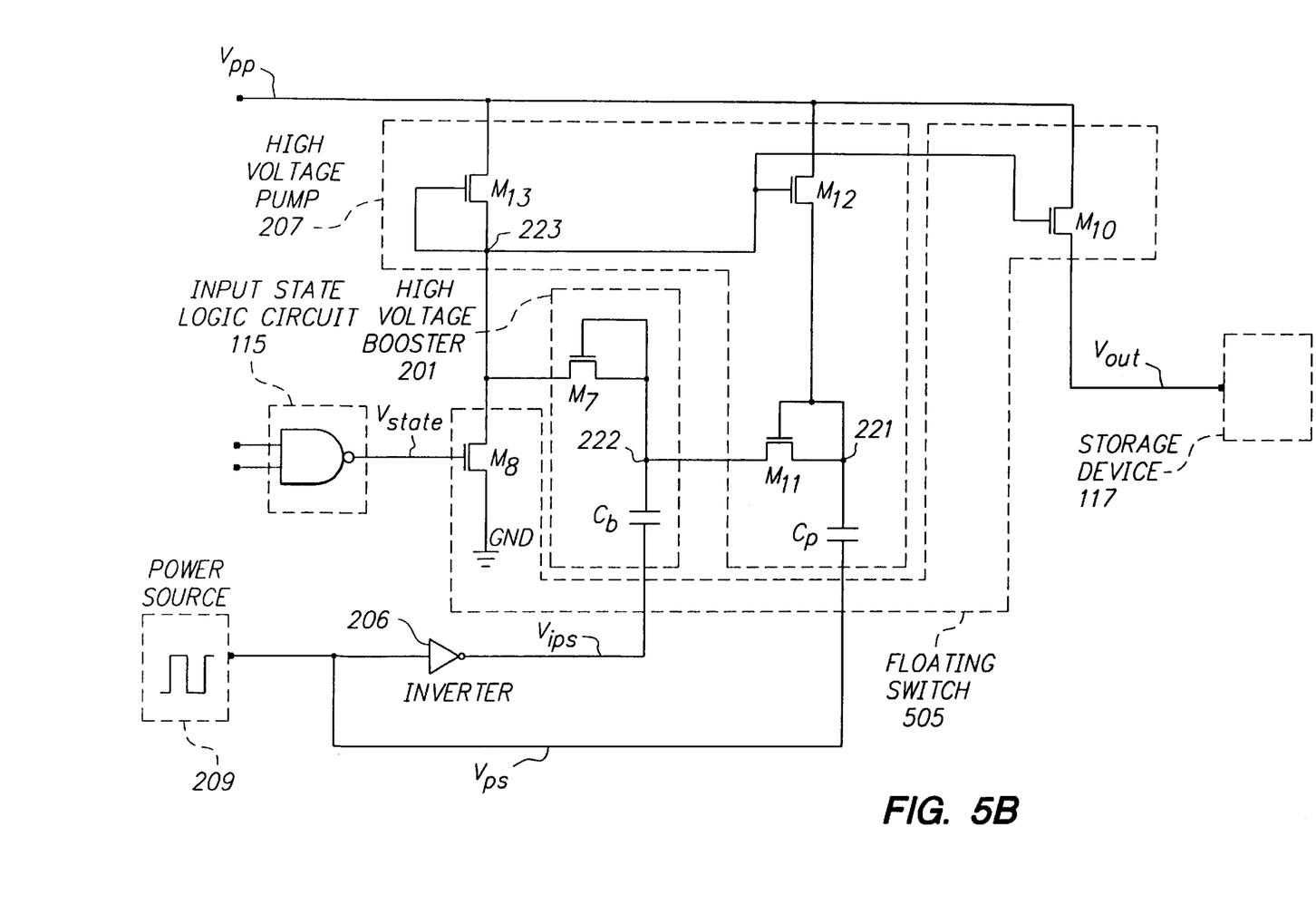
FIG. 5B is an illustration of a detailed schematic drawing of the third embodiment of the high voltage NMOS switch design.

FIG. 5B is an illustration of a detailed schematic drawing of the third preferred embodiment of the high voltage switch 500. The floating switch 505 includes two transistor switches, $M_8$ and $M_{10}$. The absence of transistor $M_9$ within the floating switch 505 ensures that at the low state logic, the switch output $V_{out}$ will never connect with ground 211. Instead, the floating switch 505 disconnects from $V_{pp}$ and due to a weak leakage current, the switch output $V_{out}$ slowly discharges into the gate substrate, thereby lowering $V_{out}$ to some voltage level below $V_{pp}$. This embodiment of the high voltage NMOS switch 500 further enables a user to adjust the high voltage switch 500 in order for the switch to operate in varying applications.

Figure 6A:
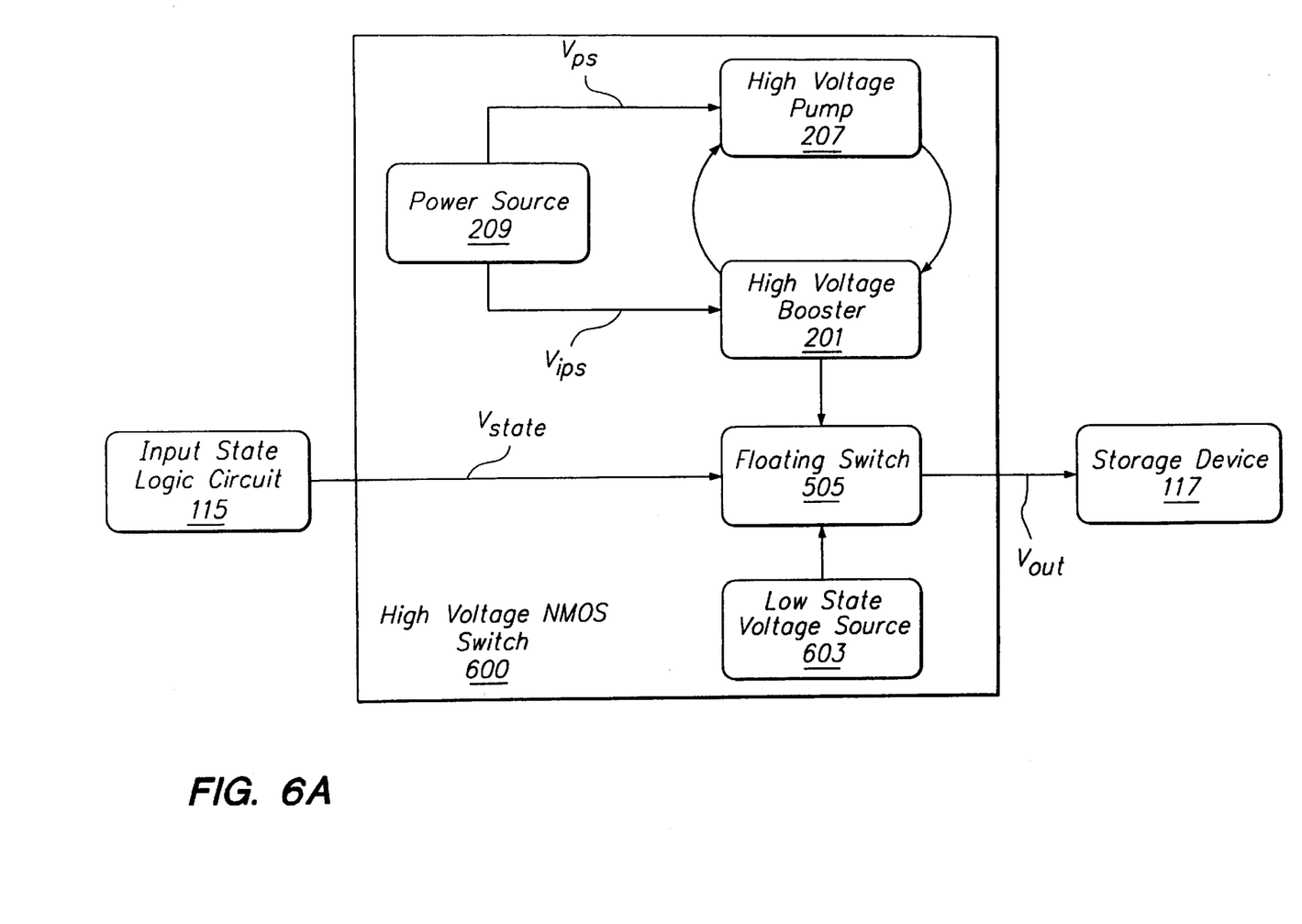
FIG. 6A is an illustration of a high level schematic drawing of a fourth embodiment of the high voltage NMOS switch design

FIG. 6A is an illustration of a high level schematic drawing of a fourth embodiment of the high voltage NMOS switch 600 of the present invention. The high voltage NMOS switch 600 includes a low state logic voltage source 603, the power source 209, the high voltage pump 207, and the high voltage booster 201. A plurality of high voltage NMOS switches 600 and the input state logic circuit 115 comprise a decoder, which is not shown. To simplify the discussion, only one of the plurality of high voltage NMOS switches 600 is illustrated.

The low state logic voltage source 603 ensures that $V_{out}$ will never drop below the voltage level $V_{dd}-V_{TM20}$ where $V_{dd}$ is some voltage less than $V_{pp}$. With such a smaller voltage swing between the low and high switch output voltage levels $V_{out}$ than previous discussed embodiments, the high voltage switch 500 in this embodiment can switch even more quickly from the low to high switch output voltage level. The low state logic voltage source 603 will be discussed in further detail in FIG. 6B.

Figure 6B:
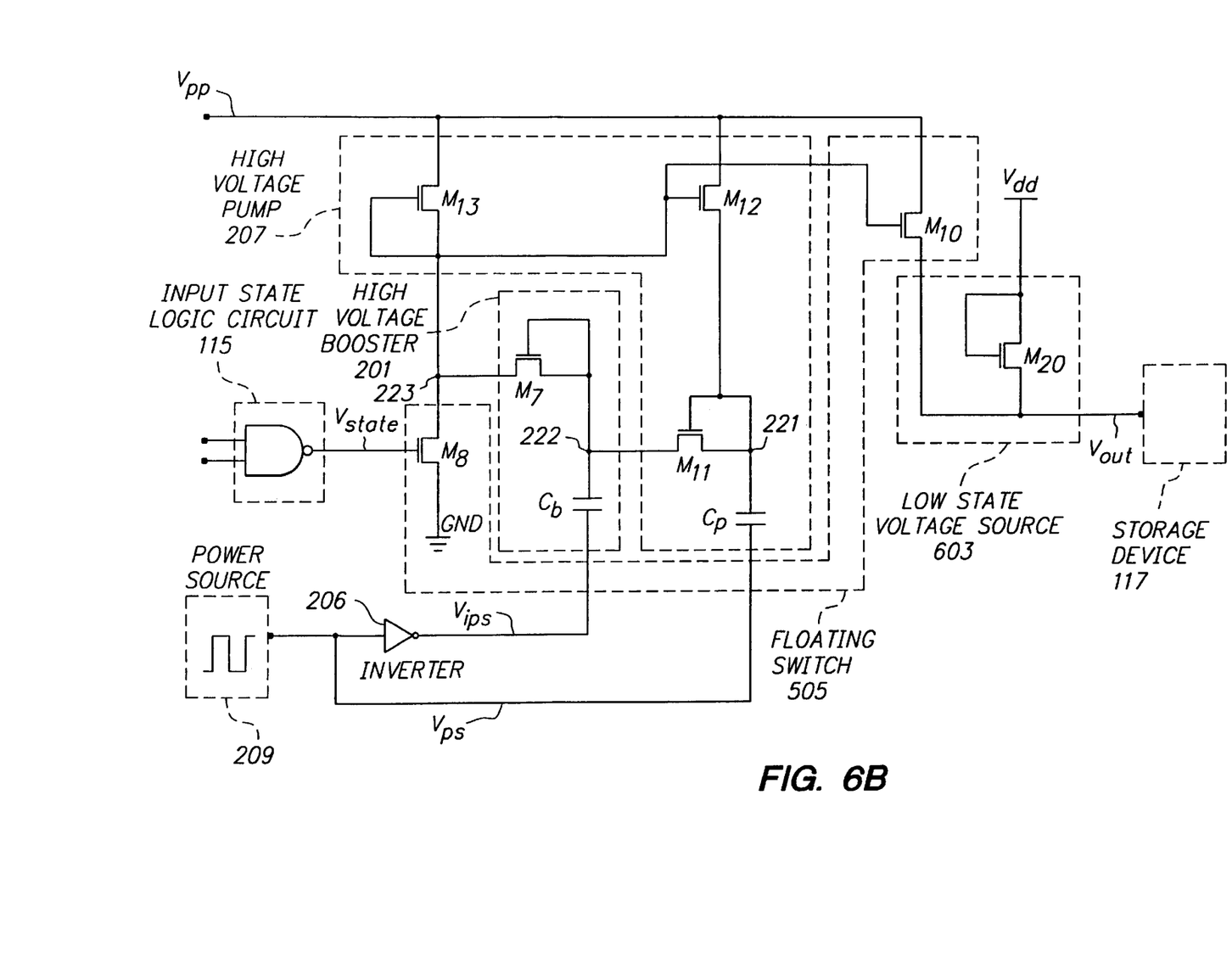
FIG. 6B is an illustration of a detailed schematic drawing of a fourth embodiment of the high voltage NMOS switch design

FIG. 6B is an illustration of a detailed schematic drawing of a fourth embodiment of the high voltage NMOS switch 600 of the present invention. The low state logic voltage source 603 includes a clamping diode transistor $M_{20}$ which is electronically coupled to the switch output $V_{out}$. When the high voltage NMOS switch 600 receives a low state logic voltage, switch transistor $M_{10}$ turns off, thereby isolating the switch output $V_{out}$. Transistor $M_{20}$, which is always turned on, continuously supplies a low voltage level $V_{ls}$ of $V_{dd}-V_{TM20}$ to the switch output $V_{out}$, which ensures that even if $V_{out}$ slowly discharges due to current leakage, $V_{out}$ will never drop below $V_{dd}-V_{TM20}$.

This maintaining of a low state voltage level $V_{ls}$ ensures that when the high voltage switch 600 next receives a high state logic voltage, the switching time between the low and high voltage levels will be shorter due to the smaller voltage swing that needs to be crossed. This embodiment, therefore, further offers the user a means for adjusting the ramp rate of the high voltage NMOS switch in order for it to operate in varying applications.

The high speed NMOS switch of the present invention provides a fast switching speed with a flexible ramp rate which does not dramatically increase the cost or complexity of the device.

While the above description contains many specificities, these should not be construed as limitations on the scope of the invention, but rather as an exemplification of several embodiments thereof. Many other variations are possible. It will be understood by those skilled in the art that various changes and modifications may be made, and equivalents may be substituted for elements thereof without departing from the true scope of the invention. For example, the ramp rate for the present invention may be further adjusted by such techniques as adjusting the oscillator frequency or the capacitance of the coupling capacitor. Accordingly, the scope of the invention should be determined not by the embodiments illustrated, but by the appended claims and their legal equivalents.

What is claimed is:

1. A high voltage switch system, electrically coupled to a power source transmitting a first signal and a second signal, the system comprising:

a high voltage pump, electrically coupled to the power source, adapted to receive the first signal from the power source and to transmit a pump signal;

a high voltage booster, electrically coupled to the power source and the high voltage pump, receiving the second signal from the power source, to receive the pump signal from the high voltage pump and to transmit a booster signal when said booster signal has a voltage level higher than the pump signal; and a switch, electrically coupled to the high voltage booster, responding to receipt of an input signal having a first logic state by receiving the booster signal and transmitting an ouput signal with a high voltage level and adapted to respond to receipt of the input signal having a second logic state by transmitting the output signal with a low voltage level.

2. The high voltage switch system of claim 1 wherein the high voltage pump includes:

a capacitor having an input and an output, the input of the capacitor, electrically coupled to the power source and receives the first signal;

a transistor diode having an input and an output, the input of the transistor diode, electrically coupled to the output of the capacitor, the output of the transistor diode to transmit the pump signal; and a transistor, having a first electrode, a second electrode and a gate electrode, the second electrode of the transistor electrically coupled to a voltage source, the first electrode of the transistor-electrically coupled to the input of the transistor diode and the gate electrode of the transistor electrically coupled to the high voltage booster, wherein the transistor assists in the ramping up of the pump signal.

3. The high voltage switch system of claim 1 wherein the high voltage booster includes:

a capacitor having an input and an output, the input of the capacitor, electrically coupled to the power source, adapted to receive the second signal; and a transistor diode, having an input and an output, the input of the transistor diode, electrically coupled to the high voltage pump and the output of the capacitor, adapted to receive the pump signal from the high voltage pump, the output of the transistor diode adapted to transmit the booster signal.

4. The high voltage switch system of claim 1 wherein the switch is electrically coupled to a voltage source having a first voltage level, wherein the high voltage level equals the first voltage level.

5. The high voltage switch system of claim 1 wherein the switch is electrically coupled to electrical ground, wherein the low voltage level equals electrical ground.

6. The high voltage switch system of claim 1 wherein the switch includes:

a first transistor, having a gate electrode, a first electrode and a second electrode, the gate electrode adapted to receive the input signal, the first electrode electrically coupled to the high voltage booster and the second electrode electrical coupled to electrical ground, wherein the first transistor responds to the input signal having the second logic state by halting a ramping up of the booster signal by the high voltage booster and the pump signal by the high voltage pump.

7. The high voltage switch system of claim 1 wherein the switch includes:

a first transistor having a gate electrode, a first electrode and a second electrode, the gate electrode of the first transistor, electrically coupled to the high voltage booster, adapted to receive the booster signal, the first electrode of the first transistor electrically coupled to a voltage source, the first transistor responding to receiving at the gate electrode the booster signal at a first voltage level by transmitting at the second electrode of the first transistor the output signal at a second voltage level.

8. The high voltage switch system of claim 7 wherein the switch further includes:

a second transistor having a gate electrode, a first electrode and a second electrode, the gate electrode of the second transistor adapted to receive the input signal, the first electrode of the second transistor electrically coupled to the second electrode of the first transistor and the second electrode of the second transistor electrically coupled to electrical ground, the second transistor responding to receiving the input signal in the second logic state by electrically coupling the second electrode of the first transistor to electrical ground, wherein the output signal transmitted by the second electrode of the first transistor is equal to electrical ground.

9. The high voltage switch system of claim 1 wherein the high voltage pump comprises a claiming diode transistor, electrically coupled to the output of the high voltage booster, adapted to prevent the booster signal from ramping up to above a first voltage level.

10. The high voltage switch system of claim 1 further comprising a storage device, electrically coupled to the switch, adapted to receive and store the output signal.

11. The high voltage switch system of claim 1 wherein the switch is electrically coupled to a first voltage source having a first voltage level, wherein the low voltage level equals the first voltage level.

12. The high voltage switch system of claim 11 wherein the first voltage source includes a transistor having a gate electrode, a first electrode and a second electrode, the gate electrode and the first electrode electrically coupled to a second voltage source having a second voltage level, the second electrode of the first voltage source electrically coupled to the high voltage booster.

13. The high voltage switch system of claim 1 wherein the switch includes:

a first transistor, having a gate electrode, a first electrode and a second electrode, the gate electrode of the first transistor adapted to receive the input signal, the second electrode of the first transistor electrically coupled to electrical ground, wherein the first transistor responds to the input signal having the second logic state by halting the ramping up of the booster signal by the high voltage booster and the pump signal by the high voltage pump; and a second transistor having a gate electrode, a first electrode and a second electrode, the gate electrode of the second transistor, electrically coupled to the high voltage booster, adapted to receive the booster signal, the first electrode of the second transistor electrically coupled to a first voltage source having a first voltage level, the second electrode of the second transistor electrically coupled to the first electrode of the first transistor, the second transistor responding to receiving at the gate electrode the booster signal at a second voltage level by transmitting at the second electrode of the second transistor the output signal at the first voltage level.

14. The high voltage switch system of claim 1 wherein the first signal is a first square waveform signal and the second signal is a second square waveform signal, wherein said first square waveform signal is the inverse of said second square waveform signal.

* * * * *

UNITED STATES PATENT AND TRADEMARK OFFICE
CERTIFICATE OF CORRECTION

PATENT NO. : 6,188,265 B1
DATED : February 13, 2001
INVENTOR(S) : Kwo-Jen Liu and Chuck Cheuk-Wing Cheng It is certified that error appears in the above-identified patent and that said Letters Patent is hereby corrected as shown below:

Title page, Item [54], and Column 1, line 1,
The Title should appear as follows, (no hyphen between "High Voltage"):
"High Voltage NMOS Switch Design";

Item [75], the 2nd Inventor's name is misspelled and should appear as:
Chuck Cheuk-Wing Cheng;

Item [73] Assignee should appear as:
Scenix Semiconductor, Inc.;

Claim 2,
Line 37, please delete "transistor - electrically", and insert (no hyphen)
-- transistor electrically --;

Claim 6,
Line 66, please delete "electrical" and insert -- electrically --.

Signed and Sealed this

Eleventh Day of December, 2001

*Attest:*

*Attesting Officer*

NICHOLAS P. GODICI
*Acting Director of the United States Patent and Trademark Office*